United States Patent
Liu

(10) Patent No.: US 9,034,679 B2
(45) Date of Patent: May 19, 2015

(54) METHOD FOR FABRICATING MULTIPLE TYPES OF MEMS DEVICES

(71) Applicant: FREESCALE SEMICONDUCTOR, INC., Austin, TX (US)

(72) Inventor: Lianjun Liu, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 13/926,652

(22) Filed: Jun. 25, 2013

(65) Prior Publication Data

US 2014/0374851 A1  Dec. 25, 2014

(51) Int. Cl.
 H01L 29/84  (2006.01)
 H01L 21/02  (2006.01)
 B81C 1/00  (2006.01)
 B81B 3/00  (2006.01)

(52) U.S. Cl.
 CPC ........... *B81C 1/00134* (2013.01); *B81B 3/0021* (2013.01); *B81C 2203/00* (2013.01)

(58) Field of Classification Search
 CPC .......... H01L 21/44; H01L 21/48; H01L 21/50
 USPC ............ 438/113, 114, 50; 257/E29.001, 415, 257/416; 73/717, 718
 See application file for complete search history.

(56) References Cited

U.S. PATENT DOCUMENTS

| 5,824,595 | A  | * | 10/1998 | Igel et al. ........................ 438/464 |
| 7,544,305 | B2 | * | 6/2009 | Hsu et al. ......................... 216/38 |
| 7,943,525 | B2 |   | 5/2011 | Zhang et al. |
| 8,216,882 | B2 |   | 7/2012 | Lin et al. |
| 8,258,590 | B2 | * | 9/2012 | Geiger et al. ................. 257/415 |
| 8,371,018 | B2 |   | 2/2013 | Chang |
| 2010/0167497 | A1 | * | 7/2010 | Fang et al. ..................... 438/443 |
| 2010/0225200 | A1 | * | 9/2010 | Kupnik et al. ................. 310/300 |
| 2012/0042731 | A1 | * | 2/2012 | Lin et al. ......................... 73/718 |
| 2013/0001710 | A1 |   | 1/2013 | Daneman et al. |

* cited by examiner

*Primary Examiner* — Selim Ahmed
*Assistant Examiner* — Changhyun Yi
(74) *Attorney, Agent, or Firm* — Charlene R. Jacobsen

(57) ABSTRACT

A method entails providing a substrate with a structural layer having a thickness. A partial etch process is performed at locations on the structural layer so that a portion of the structural layer remains at the locations. An oxidation process is performed at the locations which consumes the remaining portion of the structural layer and forms an oxide having a thickness that is similar to the thickness of the structural layer. The oxide electrically isolates microstructures in the structural layer, thus producing a structure. A device substrate is coupled to the structure such that a cavity is formed between them. An active region is formed in the device substrate. A short etch process can be performed to expose the microstructures from an overlying oxide layer.

17 Claims, 9 Drawing Sheets

METHOD FOR FABRICATING MULTIPLE TYPES OF MEMS DEVICES

TECHNICAL FIELD OF THE INVENTION

The present invention relates generally to microelectromechanical systems (MEMS) devices. More specifically, the present invention relates to methodology for fabricating a variety of types of MEMS devices.

BACKGROUND OF THE INVENTION

Microelectromechanical Systems (MEMS) devices are widely used in applications such as automotive, inertial guidance systems, household appliances, protection systems for a variety of devices, and many other industrial, scientific, and engineering systems. Such MEMS devices may be used to sense a physical condition such as acceleration, angular velocity, pressure, or temperature, and to provide an electrical signal representative of the sensed physical condition. MEMS sensor designs are highly desirable for operation in high gravity environments and in miniaturized devices, and due to their relatively low cost.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

A variety of methods and process flows exist for fabricating microelectromechanical systems (MEMS) devices in which, for example, each type of MEMS device is fabricated using device specific methodology and process flow. The large number of process flows requires higher levels of capital investment, more sustaining resources, and can result in an increased probability of production/quality issues. Additionally, the large number of process flows also makes it difficult to utilize the production volumes of different MEMS devices to improve equipment utilization, to enhance the speed of learning, and to reduce production cost. Thus, a lack of standardization of process flows presents a major challenge for cost effective fabrication of MEMS devices.

Embodiments entail methodology for fabricating MEMS devices that can be used to produce multiple types of MEMS sensor devices, as well as, MEMS devices fabricated by implementing the methodology. The methodology implements local oxidation of silicon (LOCOS) to reduce step height created by the formation of polysilicon conductive structures thereby improving planarization processes. Additionally, the methodology implements fusion bonding of substrates in order to produce devices having buried cavities without the need for long duration etch processes and without requiring release holes through the structures. A common technology platform for fabricating multiple types of MEMS devices can result in more cost effective MEMS device production, a reduction in production/quality issues, improvements in equipment utilization, and so forth.

Figure 1:
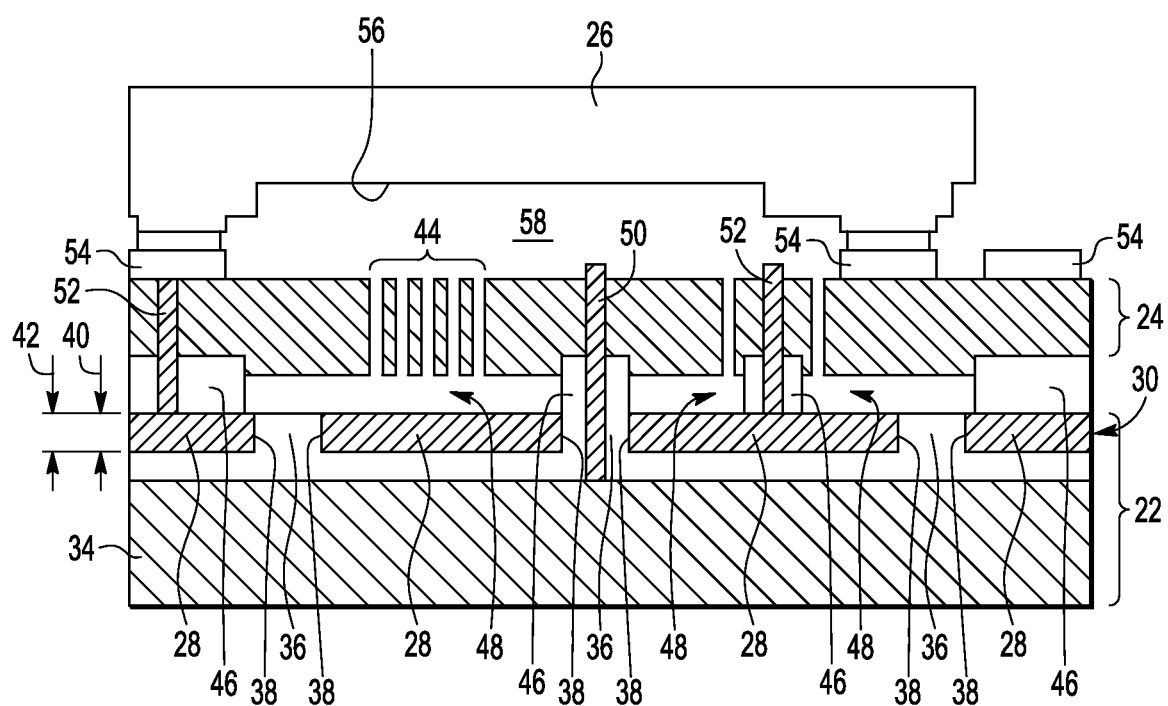
FIG. 1 schematically shows a side view of a microelectromechanical systems (MEMS) device in accordance with an embodiment.

FIG. 1 schematically shows a side view of a microelectromechanical systems (MEMS) device 20 in accordance with an embodiment. MEMS device 20 is fabricated using standardized methodology discussed in detail below that can be implemented to fabricate a variety of types of MEMS devices. MEMS device 20 generally includes a first substrate structure, referred to herein as a handle structure 22, a second substrate, referred to herein as a device structure 24, and a third substrate structure, referred to herein as a cap structure 26.

FIG. 1, as well as FIGS. 4-19, are illustrated using various shading and/or hatching to distinguish the different elements of MEMS device 20, as will be discussed below. In addition, the terms "first," "second," "third," and so forth used herein do not refer to an ordering or prioritization of elements within a countable series of elements. Rather, the terms "first," "second," "third," and so forth are used to distinguish the various elements for clarity of discussion and to provide correspondence with the terms in the claims.

Handle structure 22 has at least one conductive microstructure 28 (four illustrated) formed in a structural layer 30 on a substrate 34 and an oxide material 36 surrounding lateral sides 38 of each conductive microstructure 28. In an embodiment, microstructure 28 has a first thickness 40 and oxide material 36 has a second thickness 42 that is at least equivalent to first thickness 40.

Device structure 24 includes an active region 44 of MEMS device 20. Active region 44 may be a movable element, sometimes referred to as a proof mass, a diaphragm of a pressure sensor, or any other feature used to sense an external stimulus.

In addition, device structure 24 may include more than one active region 44 when MEMS device 20 is configured as a multi-stimulus sensing device.

In some embodiments, MEMS device 20 further includes spacer elements 46. In an embodiment, device structure 24 is coupled to handle structure 22 with spacer elements 46 interposed between structures 22 and 24. Thus, device structure 24 is in spaced apart relationship (i.e., spaced apart from) handle structure 22 so that a cavity 48 is produced between device structure 24 and handle structure 22. Additionally, active region 44 of MEMS device 20 is suspended above cavity 48 and one or more conductive microstructures 28 underlie cavity 48.

In some embodiments, one or more anchor structures 50 may extend through device structure 24 and/or through structural layer 30 of handle structure 22 to substrate 34. In addition, or alternatively, one or more contacts 52 may extend through device structure 24 and may be in electrical contact with conductive microstructures 28. In some embodiments, contacts 52 may be electrically coupled with contact pads 54, conductive traces (not shown), or other elements formed in or on device structure 24. Alternatively, or additionally, contact pads 54 may serve as a connection region for cap structure 26 with or without electrical coupling to contacts 52.

In the illustrated embodiment, cap structure 26 is coupled to device structure 24 and functions to protect active region 44 of device structure 24 from particulate matter, moisture, and other contaminants that might otherwise damage the elements of active region 44. Cap structure 26 may be formed with a recessed region 56 so that once it is coupled to device structure 24, a cavity 58 is produced between cap structure 26 and active region 44. Other embodiments may not include cap structure 26, and in still other embodiments, cap structure 26 may include one or more ports (not shown) so that active region 44 can be used to sense a particular condition, e.g., ambient pressure.

Figure 2:
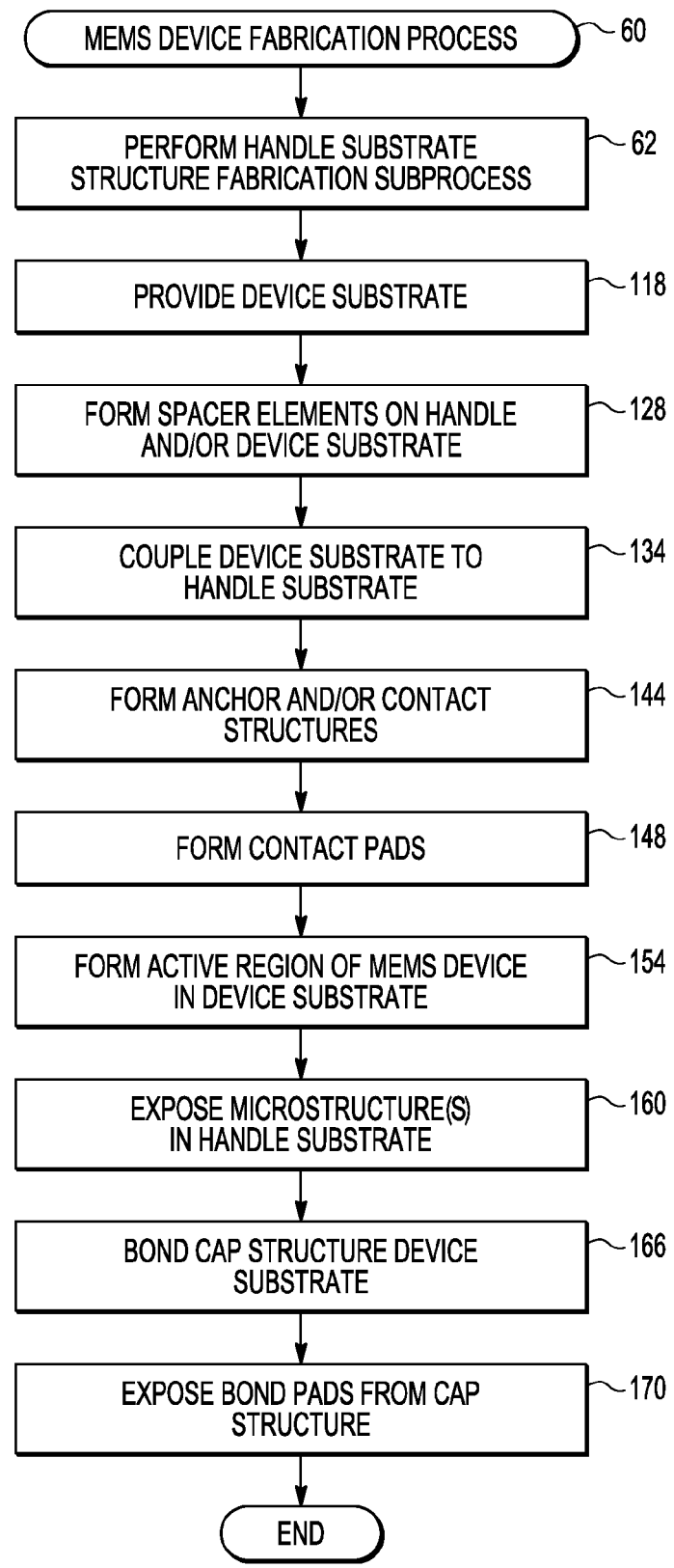
FIG. 2 shows a flowchart of a MEMS device fabrication process in accordance with another embodiment.

Referring now to FIG. 2, FIG. 2 shows a flowchart of a MEMS device fabrication process 60 in accordance with another embodiment. MEMS device fabrication process 60 represents a common technology platform of process flow and methodology for fabricating a variety of types of MEMS devices including, for example, MEMS device 20 (FIG. 1). The operations of fabrication process 60 will be discussed in connection with FIGS. 4-19 which show schematic cross-sectional views illustrating operations of MEMS device fabrication process 60. As such, reference will be made to particular ones of FIGS. 4-19 throughout discussion of the operations of fabrication process 60.

The following operations of fabrication process 60 present methodology for fabricating a single MEMS device 20 for simplicity of illustration. However, it should be understood by those skilled in the art that the following process allows for concurrent manufacturing of a plurality of MEMS devices 20. For example, multiple MEMS devices 20 may undergo concurrent semiconductor thin-film manufacturing. The individual MEMS devices 20 can then be cut, or diced, in a conventional manner to provide individual MEMS devices 20 that each can be packaged and coupled onto a printed circuit board in an end application.

Figure 3:
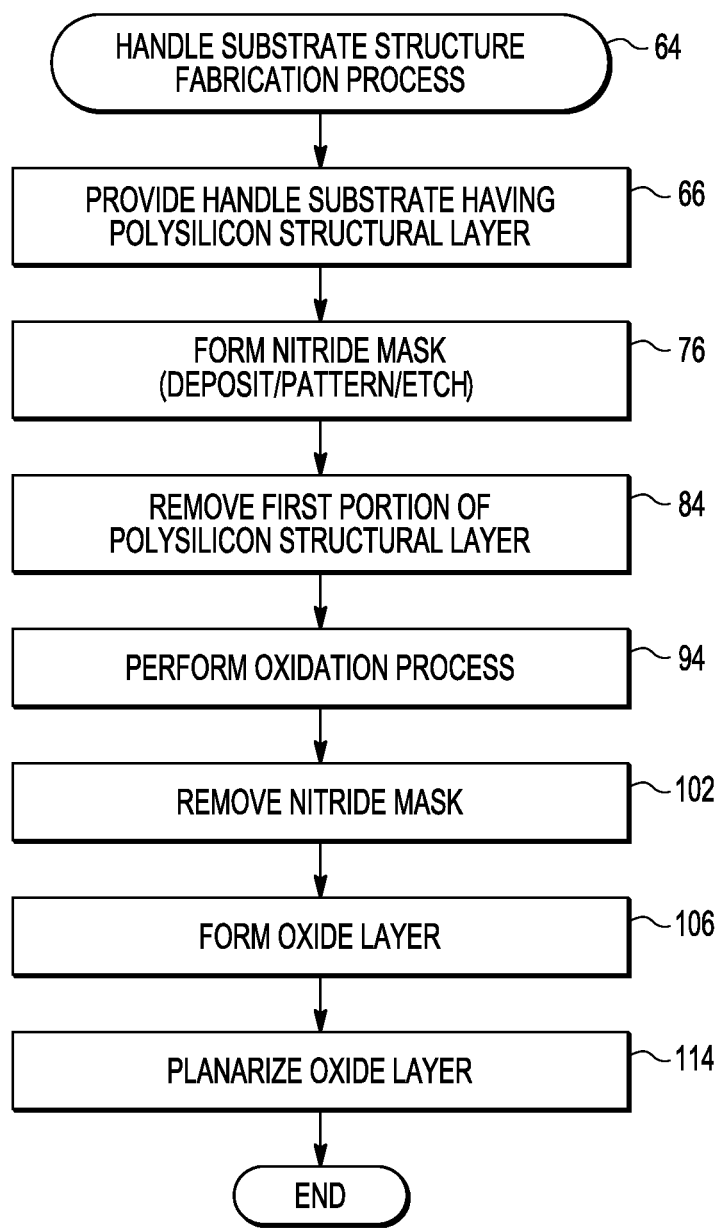
FIG. 3 shows a flowchart of a handle substrate fabrication subprocess in accordance with an embodiment.

MEMS device fabrication process 60 begins with a task 62. At task 62, a handle substrate structure fabrication subprocess is performed. Referring to FIG. 3 in connection with task 62, FIG. 3 shows a flowchart of a handle substrate structure fabrication subprocess 64 in accordance with an embodiment. In general, subprocess 64 is performed to fabricate handle substrate structure 22 (FIG. 1). Subprocess 64 will be discussed with particular reference to FIGS. 4-10. Following the description of subprocess 64, further description of MEMS device fabrication process 60 (FIG. 2) will commence.

Handle substrate structure fabrication subprocess 64 begins with a task 66. At task 66, a handle substrate is provided having a polysilicon structural layer.

Figure 4:
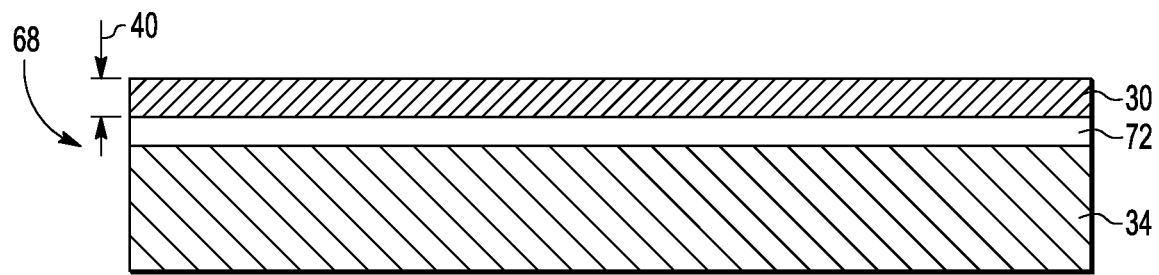
FIG. 4 shows a side view of a handle substrate structure of the MEMS device of FIG. 1 in a beginning stage of processing.

Referring to FIG. 4 in connection with task 66, FIG. 4 shows a side view of a handle substrate 68 of MEMS device 20 (FIG. 1) in a beginning stage 70 of processing. Handle substrate 68 may be provided by an outside fabricator or may, alternatively, be provided by the fabricator of MEMS device 20 (FIG. 1). In an embodiment, handle substrate 68 may include substrate 34 having undergone various surface preparation processes. By way of example, surface preparation of substrate 34 may entail backside mark formation, surface cleaning, performing a thermal oxidation process to form an oxide pad, and so forth as known to those skilled in the art. For brevity, these processes will not be described in detail herein. Accordingly, at beginning stage 70, a surface preparation layer 72 on a surface of substrate 34 may include oxide pad(s), a nitride layer, and/or a field oxide layer. These various layers within surface preparation layer 72 are not distinguished in FIG. 4 for simplicity of illustration.

Additionally, handle substrate 68 may be provided with structural layer 30 formed thereon. In an embodiment, structural layer 30 includes a polysilicon layer that is deposited on surface preparation layer 72. Following deposition, a pad/buffer oxide layer, e.g., silicon dioxide, may be deposited over the polysilicon layer using, for example, a thermal oxidation process. As such, structural layer 30 may include the polysilicon layer as well as the pad/buffer oxide layer. Structural layer 30 may have a manufactured thickness, i.e., a depth, of first thickness 40. First thickness 40 may be, for example, approximately 2 µm (i.e., two micro millimeters or microns).

With reference back to FIG. 3, following task 66, subprocess 64 continues with a task 76. At task 76, a nitride mask is formed over polysilicon structural layer 30 by nitride deposition, patterning, and etching.

Figure 5:
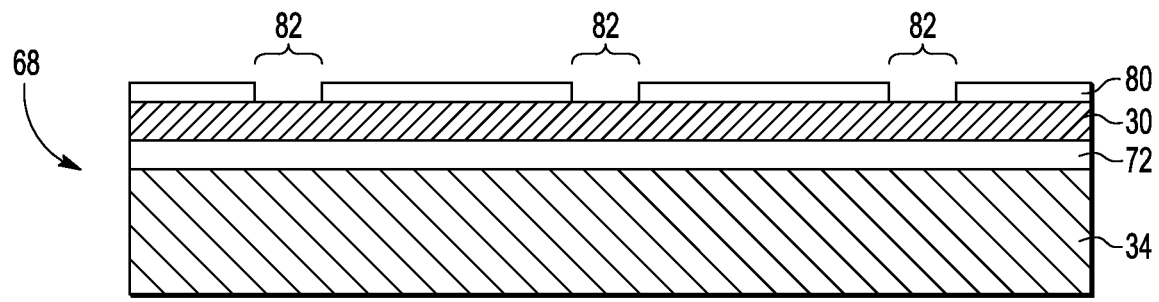
FIG. 5 shows a side view of the device of FIG. 4 in a subsequent stage of processing.

Referring to FIG. 5 in connection with task 76, FIG. 5 shows a side view of handle substrate 68 in a subsequent stage 78 of processing. At stage 78, a nitride (e.g., silicon nitride) is deposited on structural layer 30 by, for example, low-pressure chemical vapor deposition (LPCVD) to form a thin nitride layer. The nitride layer is then patterned using, for example, a photolithographic process. Finally, the nitride layer, as well as the underlying pad/buffer oxide layer, are etched to produce a patterned nitride layer, i.e., a nitride mask 80, as shown at stage 78. Nitride mask 80 covers and protects structural layer 30 at certain regions where microstructures 28 (FIG. 1) are to be formed and exposes structural layer 30 at predetermined locations 82 in accordance with a particular design specification for MEMS device 20 (FIG. 1).

Referring back to FIG. 3, following task 76, a task 84 is performed. At task 84, a first portion of structural layer 30 is removed at predetermined locations 82.

Figure 6:
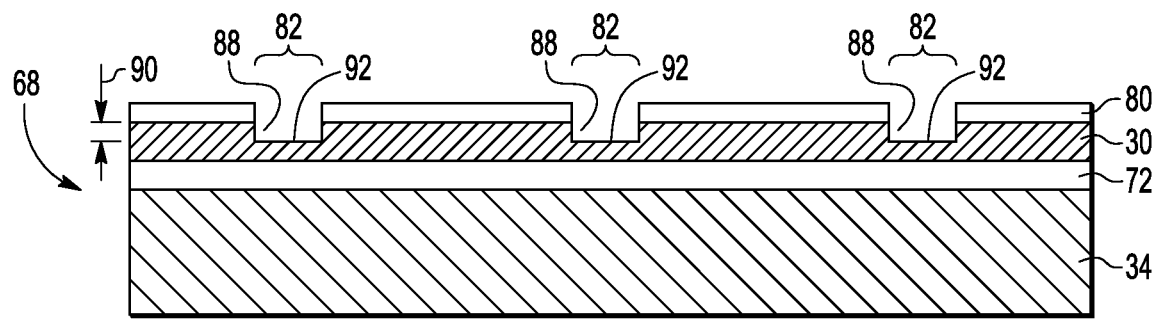
FIG. 6 shows a side view of the device of FIG. 5 in a subsequent stage of processing.

With reference to FIG. 6 in connection with task 84, FIG. 6 shows a side view of handle substrate 68 in a subsequent stage 86 of processing. At task 84, a partial etch process is performed at predetermined locations 82 to remove a first portion 88 of the exposed structural layer 30 at predetermined locations 82, where an etch depth, i.e. a thickness 90 of the removed first portion 88 of structural layer 30, is less than thickness 40 of structural layer 30. Thus, a second portion 92 of structural layer 30 remains at predetermined locations 82. In some embodiments, thickness 90 of first portion 88 is approximately one half of thickness 40 of structural layer. For example, with structural layer 30 having thickness 40 of approximately 2 μm, a partial etch depth, i.e., thickness 90 of first portion 88, may be approximately 1 μm. As shown in FIG. 6, first portion 88, i.e., the portion of structural layer 30 that was removed at task 84, is represented by an absence of material at predetermined locations 82. The remaining portion 92 of structural layer 30 is represented by the presence of material at predetermined locations 82.

Referring back to FIG. 3, following partial etch task 84 of handle substrate fabrication subprocess 64, a task 94 is performed. At task 94, an oxidation process is performed at predetermined locations 82 to form an oxide at predetermined locations 82.

Figure 7:
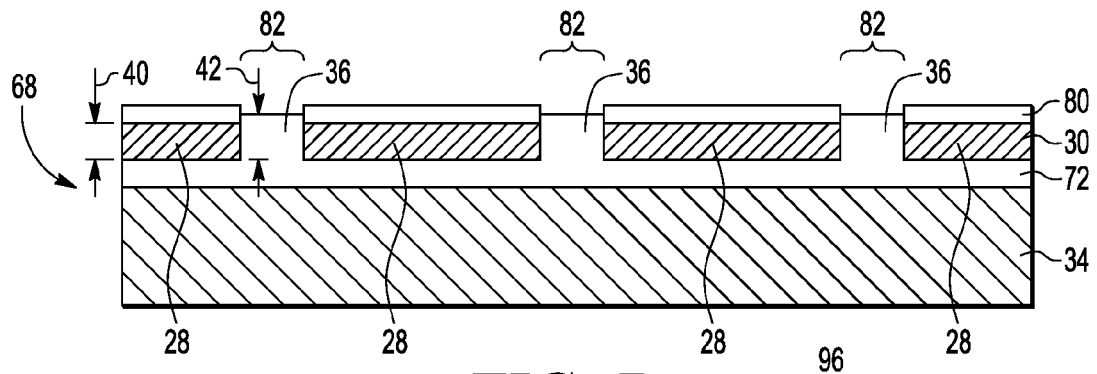
FIG. 7 shows a side view of the device of FIG. 6 in a subsequent stage of processing.

With reference to FIG. 7 in connection with task 94, FIG. 7 shows a side view of handle substrate 68 in a subsequent stage 96 of processing. In some embodiments, the oxidation process executed at task 94 may be a local oxidation of silicon (LOCOS) process. LOCOS is a microfabrication process in which silicon oxide is grown in selected areas, e.g., predetermined locations 82, by thermal oxidation on silicon. During thermal oxidation executed at task 94, the remaining silicon, i.e., second portion 92 (FIG. 6) of structural layer 30, is entirely "consumed" and "replaced" by oxide material 36, referred to hereinafter as oxide 36. The presence of nitride mask 80 does not permit the formation of oxide 36 at those areas of structural layer 30 protected by nitride mask 80.

The execution of partial etch task 84 and oxidation task 94 of subprocess 64 produces microstructures 28 in structural layer 30 and oxide 36 formed by LOCOS entirely fills predetermined locations 82 between adjacent microstructures 28. Oxide 36 thus provides electrical isolation between adjacent conductive microstructures 28. As mentioned previously, thickness 90 (FIG. 6) of first portion 88 is approximately one half of thickness 40 of structural layer. Following tasks 84 and 94 in which second portion 92 (FIG. 6) is entirely consumed, thickness 42 of oxide 36 that "replaced" second portion 92 is similar to thickness 40 of structural layer 30. That is, thickness 42 of oxide 36 may be equivalent to thickness 40 or within 0.5 μm (thinner or thicker) of thickness 40. In one example, oxidation of second portion 92 by LOCOS may produce thickness 42 of oxide 36 of approximately 2.5 μm when structural layer 30 is 2 μm. Accordingly, thickness 42 of oxide 36 may be approximately 0.5 μm greater than thickness 40 of structural layer 30.

In conventional MEMS processing, a polysilicon structural layer, e.g., structural layer 30, may be etched through its entire thickness, e.g., thickness 40, using known processes, such as, reactive ion etching (RIE), to produce a patterned polysilicon layer of microstructures, e.g., microstructures 28. Subsequent conventional deposition processes of sacrificial oxide materials, structural materials, and so forth can produce relatively large steps or dips, e.g., greater than 1 μm, at the regions where the structural layer was removed, e.g., predetermined locations 82.

Process operations require these additional material layers to be very flat. Accordingly, subsequent conventional process operations call for planarization using, for example, chemical-mechanical planarization (CMP). CMP typically uses an abrasive and corrosive chemical slurry in conjunction with a polishing pad to remove material in a planar and uniform fashion. A limitation of CMP usage in semiconductor fabrication is that the soft polish pad used in CMP can deform during polishing. For example, in an oxide polishing process, if the oxide material is too non-uniform, that is, the steps and dips are too large (greater than 1 μm), then deformation of the polish pad can result in inadequate planarization.

If the oxide remains too non-uniform following CMP, then the wafer may need to be repolished which is time-consuming and costly, and therefore unattractive in production. Accordingly, the combination of partial etch task 84 and LOCOS task 94 circumvents this problem by generally filling predetermined locations 82 with oxide 36 while effectively minimizing the step height in subsequent layers.

Returning now to FIG. 3, following oxidation task 94, subprocess 64 continues with a task 102. At task 102, nitride mask 80 is removed.

Figure 8:
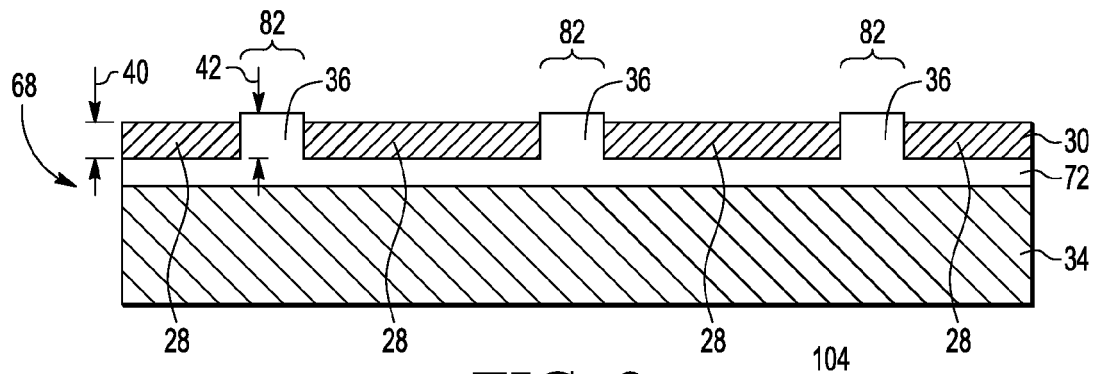
FIG. 8 shows a side view of the device of FIG. 7 in a subsequent stage of processing.

Referring to FIG. 8 in connection with task 94, FIG. 8 shows a side view of handle substrate 68 of FIG. 7 in a subsequent stage 104 of processing. As shown, nitride mask 80 (FIG. 7) is removed using a conventional technique, such as wet nitride etch. It is particularly visible in FIG. 7 that second portion 92 (FIG. 6) of structural layer 30 has been consumed at predetermined locations 82 to yield thickness 42 of oxide 36 that is slightly greater than thickness 40 of the remaining structural layer 30 of microstructures 28.

With reference back to FIG. 3, subprocess 64 continues with a task 106. At task 106, the structure may undergo oxide deposition.

Figure 9:
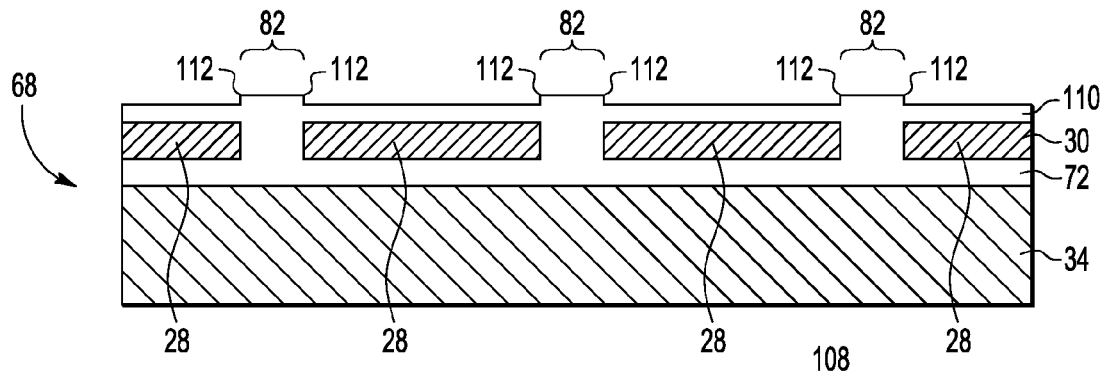
FIG. 9 shows a side view of the device of FIG. 8 in a subsequent stage of processing.

Referring to FIG. 9 in connection with task 106, FIG. 9 shows a side view of handle substrate 68 of FIG. 8 in a subsequent stage 108 of processing. At stage 108, an oxide layer 110 has been formed over microstructures 28 of structural layer 30, as well as over oxide 36 at predetermined locations 82. Again, due to the relatively low step height of oxide 36, deposition of oxide layer 110 results in steps 112 that are relatively low, e.g., 0.5 μm. It should be noted in the various figures including, for example, FIGS. 8 and 9, that steps 112 appear sharp or steep. In actual practice, however, these steps 112 may be more rounded due to the particular process operations. In other process steps, not shown and not discussed in detail herein, oxide layer 110 may undergo a densification process, or high temperature thermal annealing, to increase the density of oxide layer 110.

With reference back to FIG. 3, subprocess 64 continues with a task 114 following task 106. At task 114, oxide layer 110 (FIG. 9) is planarized.

Figure 10:
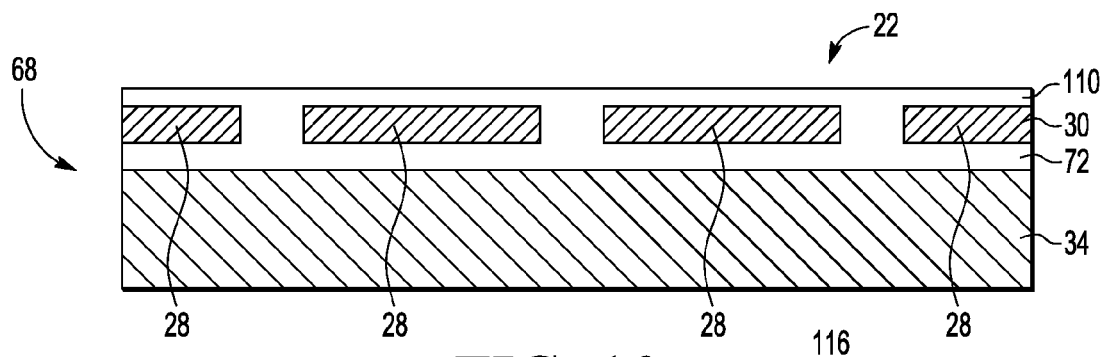
FIG. 10 shows a side view of the device of FIG. 9 in a subsequent stage of processing.

Referring to FIG. 10 in connection with task 114, FIG. 10 shows a side view of handle substrate 68 of FIG. 9 in a subsequent stage 116 of processing. At stage 116, oxide layer 112 has been planarized using, for example, CMP. That is, oxide layer 112 has been polished to remove, for example, approximately 0.5 μm of oxide layer 112 in order to largely remove steps 112 (FIG. 10) and thereby yield handle structure 22.

Returning back to FIG. 3, following planarization task 114, handle structure 22 has been produced from handle substrate 68 via the fabrication operations of subprocess 64, and handle substrate fabrication subprocess 64 ends. Following the execution of subprocess 64, process flow returns to MEMS device fabrication process 60 (FIG. 2). Accordingly, with reference back to FIG. 2, process flow continues with a task 118. At task 118, a device substrate is provided. Although handle substrate fabrication subprocess 64 is described as being performed prior to other activities within MEMS device fabrication process 60, it should be understood than subprocess 64 may be performed later than or concurrent with other activities within MEMS device fabrication process 60.

Figure 11:
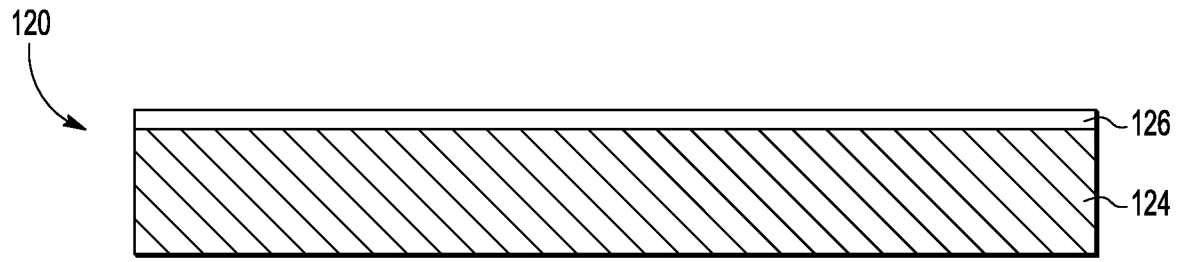
FIG. 11 shows a side view of a device substrate of the MEMS device of FIG. 1 at an initial stage of processing.

Now referring to FIG. 11 in connection with task 118, FIG. 11 shows a side view of a device substrate 120 of MEMS device 20 (FIG. 1) at an initial stage 122 of processing. Device substrate 120 may be a polysilicon wafer 124 upon which an oxide pad 126 is formed. Device substrate 120 may be provided by an outside fabricator or may, alternatively, be provided by the fabricator of MEMS device 20 (FIG. 1).

Referring back to FIG. 2, following the provision of device substrate 120 at task 118, fabrication process 60 continues with a task 128. At task 128, spacer elements 46 (FIG. 1) are formed on one or both of handle substrate 68 and device substrate 120.

Figure 12:
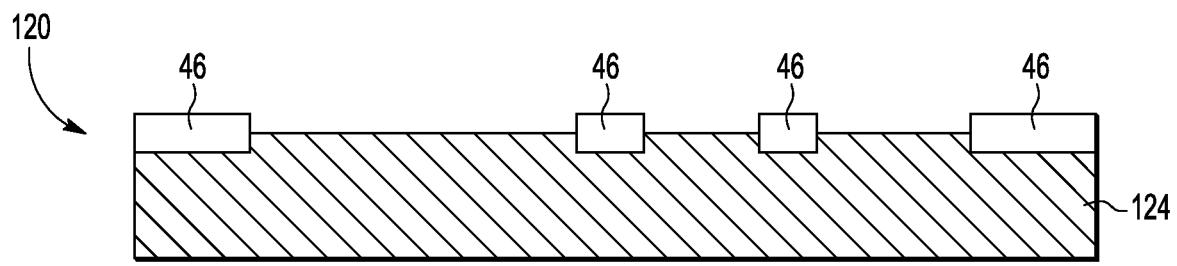
FIG. 12 shows a side view of the device of FIG. 11 at a subsequent stage of processing.

With reference to FIG. 12 in connection with task 128, FIG. 12 shows a side view of the device substrate 120 of FIG. 11 at a subsequent stage 130 of processing. As shown in FIG. 12, device substrate 120 includes spacer elements 46 formed thereon. Spacer elements 46 may be formed by a number of processes such as nitride deposition and etching to form a nitride mask (not shown), thermal oxidation of the polysilicon to produce spacer elements 46, subsequent removal of the nitride mask, and edge trim and clean.

Figure 13:
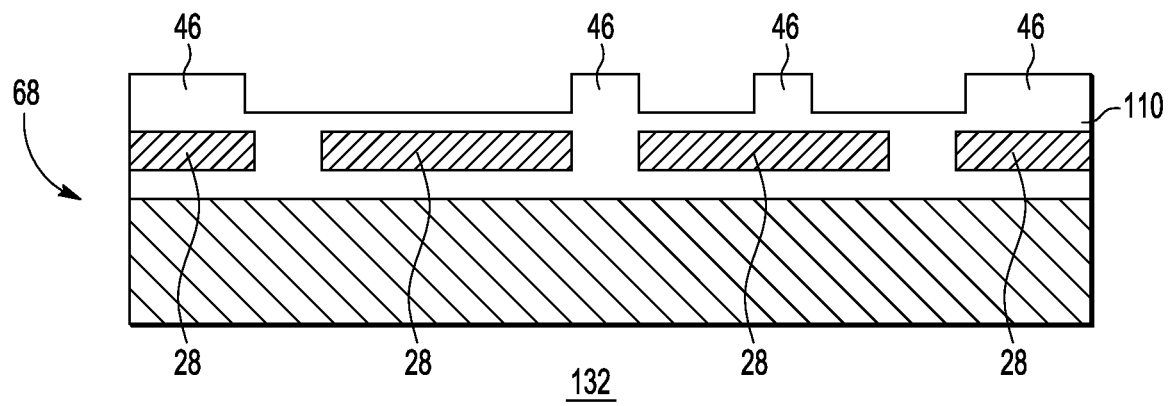
FIG. 13 shows a side view of the device of FIG. 10 at a subsequent stage of processing in an alternative embodiment.

Referring now to FIG. 13 in connection with task 128, FIG. 13 shows a side view of handle substrate 68 of FIG. 10 at a subsequent stage 132 of processing in accordance with an alternative embodiment. In some embodiments, it may be useful to form spacer elements 46 on handle substrate 68 in lieu of forming spacer elements 46 on device substrate 120 (FIG. 12). Such an approach could reduce device substrate 120 to handle substrate 68 bonding alignment complexity. Accordingly, spacer elements 46 may be formed on handle substrate 68 by increasing a thickness of oxide layer 110 from, for example, 1 μm, to 2-2.5 μm. Process steps to form spacer elements 46 on handle substrate 68 may then include densification, oxide CMP (target thickness of oxide on polysilicon after CMP could be approximately 1.2 μm), mask at the locations of spacer elements 46, followed by oxide etch and clean.

With reference back to FIG. 2, following formation of spacer elements 46 at task 128, fabrication process 60 continues with a task 134. At task 134, device substrate 120 is coupled to handle substrate 68.

Figure 14:
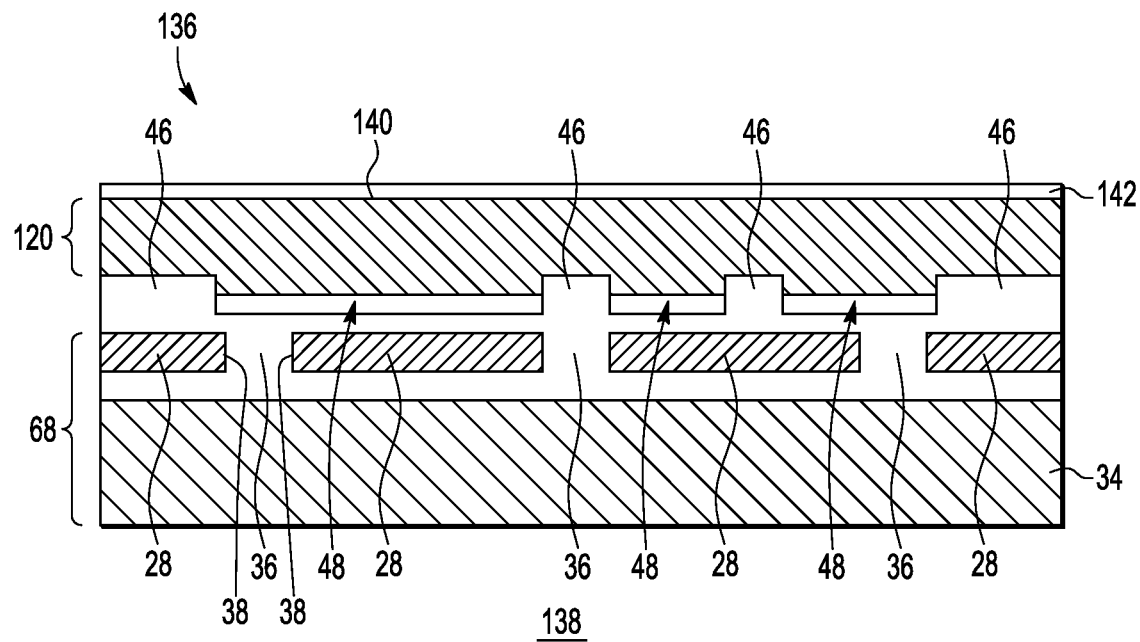
FIG. 14 shows a side view of the device substrate coupled with the handle substrate at a subsequent stage of processing.

Referring to FIG. 14 in connection with task 134, FIG. 14 shows a side view of device substrate 120 coupled with handle substrate 68 to form a composite structure 136 at a subsequent stage 138 of processing. In an embodiment, device substrate 120 may be coupled with handle substrate 68 using a fusion bonding technique. Fusion bonding, sometimes referred to as silicon direct bonding, can be used to bond two or more silicon wafers or silicon oxide wafers, without additional intermediate layers, and is based on chemical bonds between the two wafers. Fusion bonding at task 134 may entail pre-bond cleaning, fusion bonding of device substrate 120 and handle substrate 68, and bond anneal processes. Follow bonding, additional processes may include backgrinding and CMP on an exposed surface 140 of device substrate 120, and oxidation or deposition of an oxide layer 142 on exposed surface 140 of device substrate 120. Those skilled in the art will recognize that other wafer coupling processes may be utilized in lieu of fusion bonding.

Device substrate 120 is coupled with handle substrate 68 by, for example, spacer elements 46, so that device substrate 120 is spaced apart relationship with, i.e., spaced apart from, handle substrate 68 so that one or more cavities 48 are formed between handle substrate 68 and device substrate 120. Additionally, oxide 36 surrounding lateral sides 38 of microstructures electrically isolates conductive microstructures 28 from one another. Thus, the fabricated structures 68 and 120, as well as the fusion bonding technique of task 134, can be implemented to manufacture composite structure 136 with a buried cavity 48.

With reference back to FIG. 2, following coupling task 134, fabrication process 60 continues with a task 144. At task 144, anchor structures 50 (FIG. 1) and/or contacts 52 may be formed.

Figure 15:
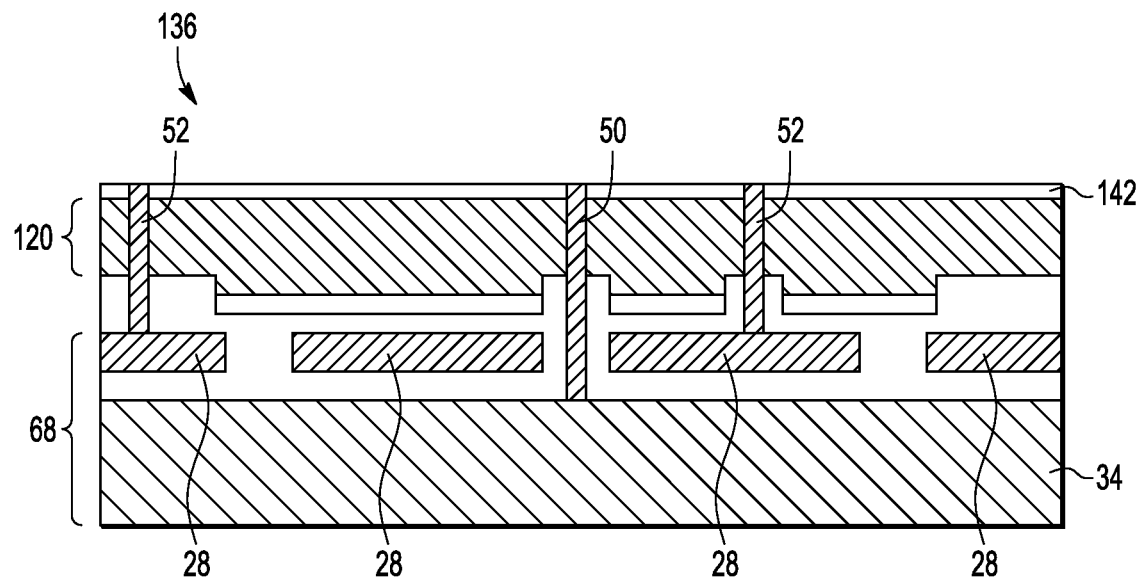
FIG. 15 shows a side view of the device of FIG. 14 at a subsequent stage of processing.

Referring to FIG. 15 in connection with task 144, FIG. 15 shows a side view of composite structure 136 of FIG. 14 at a subsequent stage 146 of processing. At stage 146, process steps in some embodiments include, for example, forming a mask (not shown) for anchor structures 50 and contacts 52, etching oxide layer 142 at the locations of anchor structures 50 and contacts 52, performing a deep reactive ion etch (DRIE) process at the locations of anchor structures 50 and contacts 52, depositing polysilicon for anchor structures 50 and contacts 52, backside grind and CMP, frontside polysilicon CMP, and annealing. Following this process flow anchor structures 50 and contacts 52 are thus formed.

With reference back to FIG. 2, following task 144, and task 148 may be performed. At task 148, contact pads 54 (FIG. 1) may be formed on device substrate 120.

Figure 16:
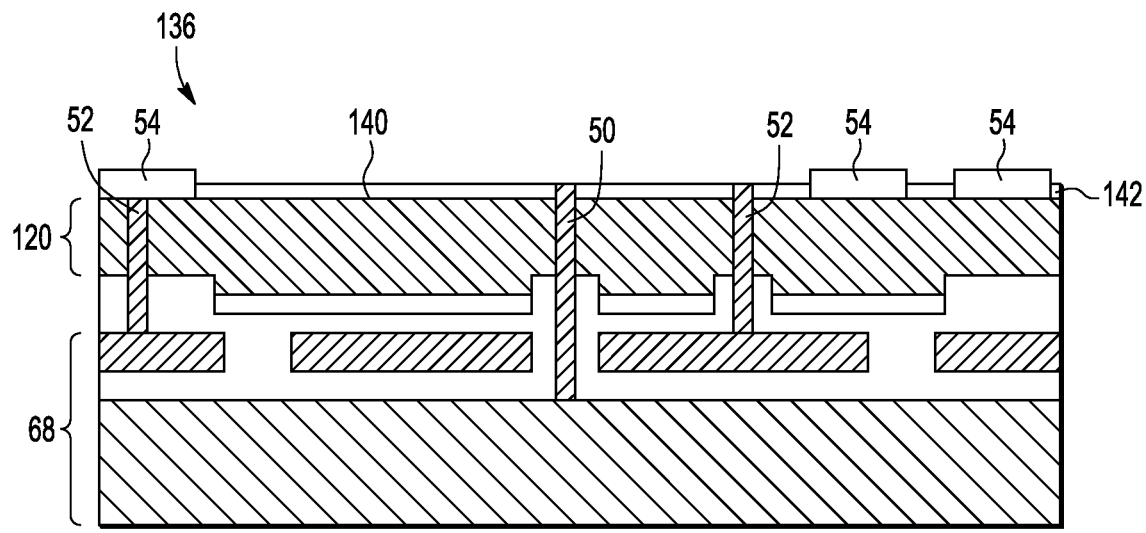
FIG. 16 shows a side view of the device of FIG. 15 at a subsequent stage of processing.

Referring to FIG. 16 in connection with task 148, FIG. 16 shows a side view of composite structure 136 of FIG. 15 at a subsequent stage 150 of processing. As shown at stage 150, contact pads 54 are formed on exposed surface 140 of device substrate 120. At stage 150, process steps in some embodiments include forming a mask (not shown) for contact pads 54, etching oxide layer 142 at the locations for contact pads 54, sputtering a layer of conductive material, e.g., aluminum, forming a mask (not shown) for contact pads 54, and etching of the conductive material, e.g., aluminum. Following this process flow, contact pads 54 are thus formed.

Referring back to FIG. 2, a task 154 is performed following task 148. At task 154, one or more active regions 44 (FIG. 1) of MEMS device 20 (FIG. 1) are formed in device substrate 120. Thus, active regions 44 are formed after device substrate 120 has been coupled to handle substrate 68.

Figure 17:
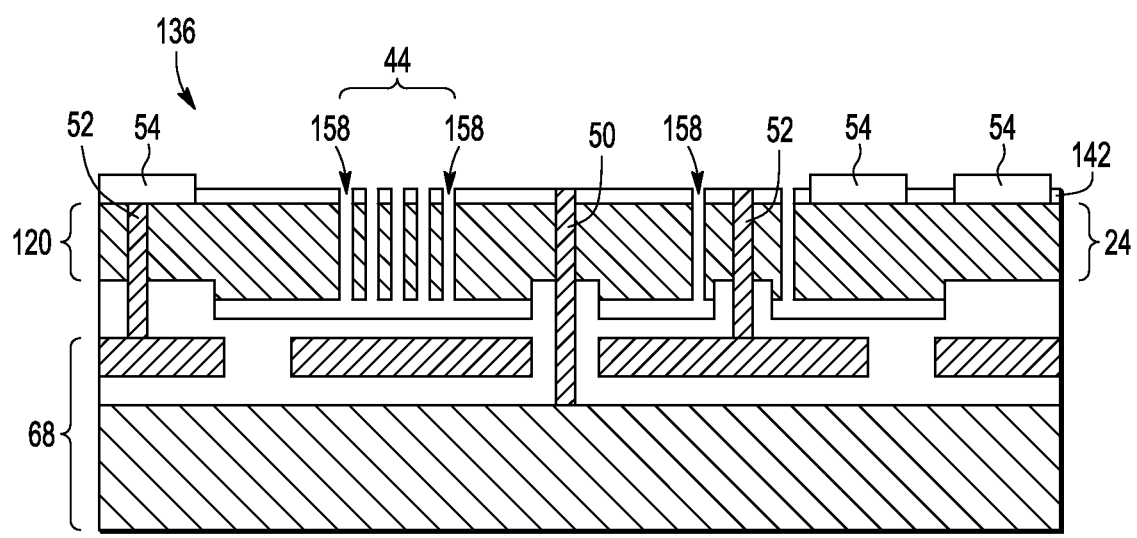
FIG. 17 shows a side view of the device of FIG. 16 at a subsequent stage of processing.

With reference to FIG. 17 in connection with task 154, FIG. 17 shows a side view of composite structure 136 of FIG. 16 at a subsequent stage 156 of processing. As shown, openings 158 are formed extending through device substrate 120 in accordance with a particular design of active region 44 of MEMS device 20 (FIG. 1). At stage 156, process steps in some embodiments include, for example, forming a mask (not shown) for openings 158 and performing an etch process such as DRIE to form openings 158 extending through the entire thickness of device substrate 120. As such, device structure 24 has been produced via the various fabrication operations performed on device substrate 120.

Referring back to FIG. 2, following task 154, a task 160 is performed. At task 160, microstructures 28 (FIG. 1) in handle substrate 68 (FIG. 2) are exposed. In particular, oxide layer 110 (FIG. 10) overlying microstructures 28 is removed.

Figure 18:
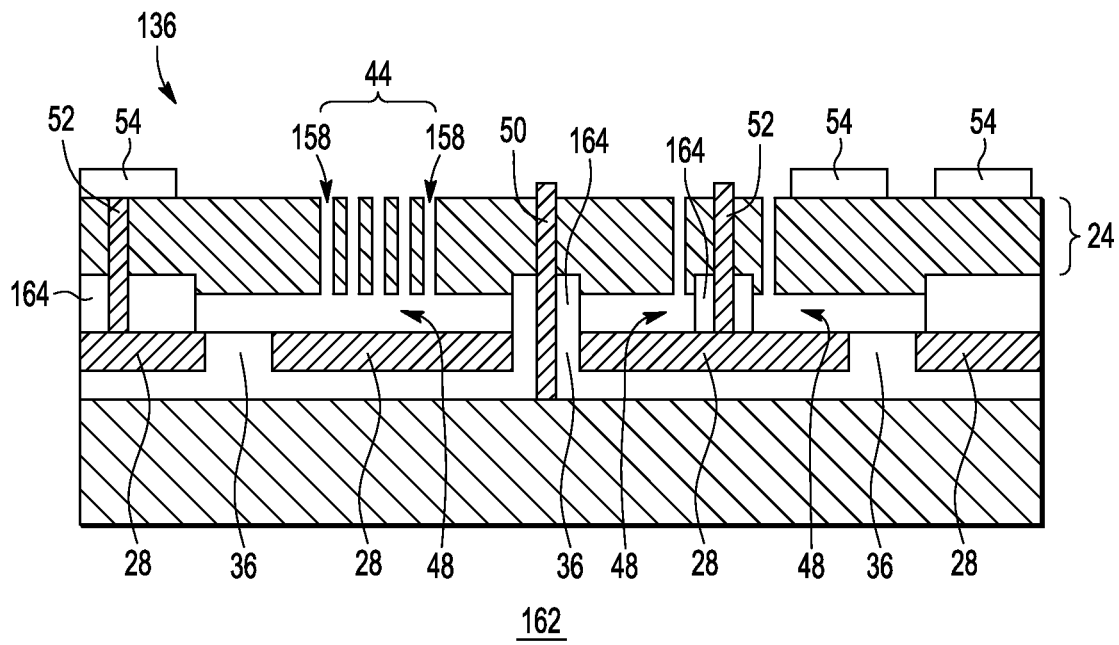
FIG. 18 shows a side view of the device of FIG. 17 at a subsequent stage of processing.

With reference to FIG. 18 in connection with task 160, FIG. 18 shows a side view of composite structure 136 of FIG. 17 at a subsequent stage 162 of processing. As shown, oxide layer 110 (FIG. 10) is absent from microstructures 28. At stage 162, process steps include, for example, performing an etch step to remove oxide layer 110. In some embodiments, a vapor phase etch (VPE) process may be used to remove oxide layer 110 and expose conductive microstructures 28, and thereby yield device structure 24. VPE is a dry etching method in which a wafer to be etched may be placed inside a chamber in which one or more gases are introduced. The material to be etched is dissolved at the surface in a chemical reaction with the gas molecules. Those skilled in the art will appreciate that other suitable etch processes may be implemented in lieu of VPE. Those skilled in the art will appreciate that another suitable etch process may be implemented in lieu of VPE.

In accordance with an embodiment, oxide layer 110 is relatively thin, i.e., <1 μm, with cavities 48 formed according to methodology presented above. Accordingly, a relatively short duration timed VPE process can be performed. Since a relatively short VPE process is being performed, excessive etching of anchor regions 164 surrounding anchor structure 50 and contacts 52 will not occur. This processing technique is in contrast to prior methodologies in which a much thicker sacrificial oxide layer is deposited over the microstructures, e.g., microstructures 28. The sacrificial oxide layer can be on the order of 2 μm thick, and typically there is no buried cavity above the sacrificial layer. In such a case, the sacrificial oxide layer will need to be laterally etched, for example, by VPE, a significant distance (5-9 μm) in order to release the movable structure, e.g., a proof mass. The relatively thick sacrificial oxide layer, as well as the relatively great lateral etch distance, calls for a longer duration timed VPE process. Accordingly, a relatively long duration VPE is subsequently performed to expose any underlying microstructures and to form a cavity between the active region and the underlying handle substrate. In order to perform this relatively long duration VPE without excessive damage to the anchor regions, the polysilicon surrounding anchor structures and contacts, e.g., elements 50 and 52, has to be made correspondingly large so that they do not become too small and mechanically weak due to the long duration timed etch process. Of course, an element that is made larger is counter to the miniaturization requirements for MEMS devices.

With reference back to FIG. 2, following the VPE process of task 160, MEMS device fabrication process 60 continues with a task 166. At task 166, a cap substrate may be bonded to composite structure 136.

Figure 19:
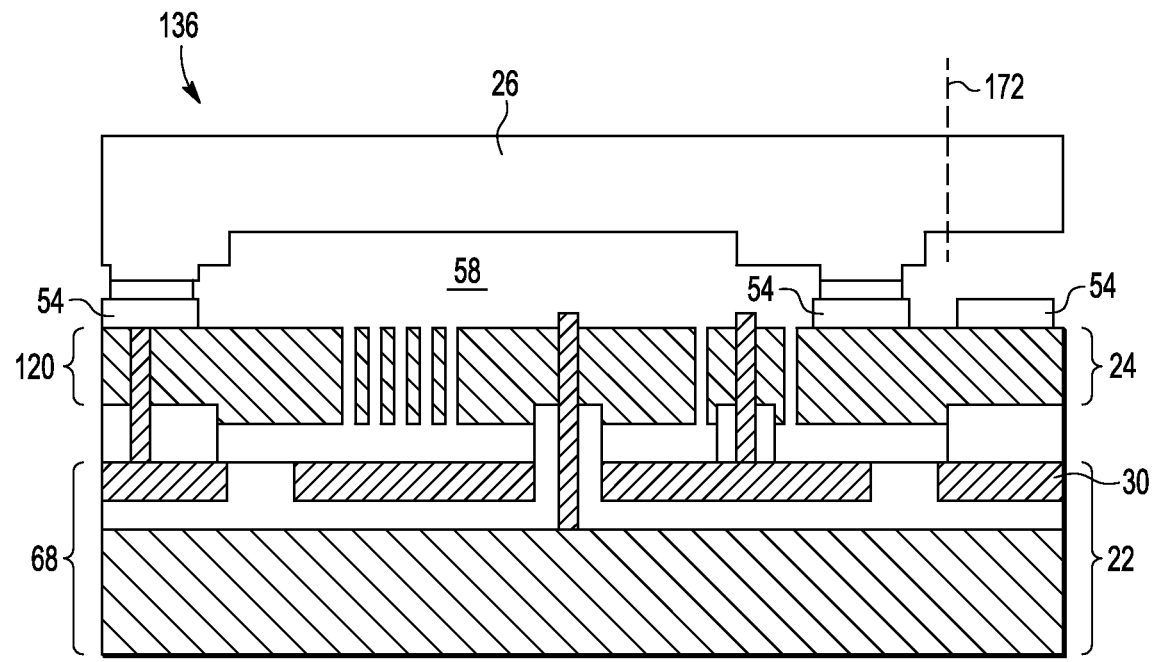
FIG. 19 shows a side view of the device of FIG. 18 at a subsequent stage of processing.

Referring to FIG. 19 in connection with task 166, FIG. 19 shows a side view of composite structure of FIG. 18 at a subsequent stage 168 of processing. As shown, cap structure 26 is coupled to device substrate 120 of composite structure 136 so that device structure 24 is interposed between handle structure 22 and cap structure 26. Cap structure 26 may be coupled to device substrate 120 via eutectic bonding. However, other bonding techniques may alternatively be implemented. In some configurations, electrical interconnection between contact pads 54 and devices within composite structure 136 may be within structural layer 30 so that they are not shorted by the eutectic bonding layer between device structure 24 and cap structure 26.

With continued reference to FIGS. 2 and 19, MEMS device fabrication process 60 may continue with a task 170. At task 170, a portion of cap structure 26 may be removed to reveal at least some of contact pads 54. As demonstrated in FIG. 19, a saw- or a grind-to-reveal process may be performed at, for example, a dashed line 172 so that the underlying contact pad(s) 54 is exposed from cap structure 26 as shown in FIG. 1. Following task 170, subsequent operations may be performed of MEMS device fabrication process 60 that are not described herein for brevity. These operations may include backgrinding, device testing, wirebonding, and so forth. Thereafter, MEMS device fabrication process 60 ends having produced MEMS device 20.

Embodiments entail methodology for fabricating MEMS devices that can be used to produce multiple types of MEMS sensor devices and MEMS devices fabricated by implementing the methodology. The methodology implements local oxidation of silicon (LOCOS) to reduce step height created by the formation of polysilicon conductive structures thereby improving planarization processes. Additionally, the methodology implements fusion bonding of substrates in order to produce devices having buried cavities without the need for long duration etch processes and without requiring release holes through the structures. A common technology platform for fabricating multiple types of MEMS devices can result in more cost effective MEMS device production, a reduction in production/quality issues, improvements in equipment utilization, and so forth.

Although a particular MEMS device architecture is described in conjunction with FIGS. 1 and 4-19, embodiments may be implemented in MEMS devices having other architectures as well. Furthermore, certain process blocks described in connection with the MEMS device fabrication methodology may be performed in parallel with each other or with performing other processes, and/or the particular ordering of the process blocks may be modified, while achieving substantially the same result. These and other such variations are intended to be included within the scope of the inventive subject matter.

While the principles of the inventive subject matter have been described above in connection with specific apparatus and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:
1. A method comprising:
providing a substrate having a structural layer formed thereon, said structural layer having a first thickness;
removing a first portion of said structural layer at a predetermined location on said structural layer, said first portion of said structural layer having a second thickness that is less than said first thickness so that a second portion of said structural layer remains at said predetermined location; and
performing an oxidation process at said predetermined location to form an oxide, said oxidation process consuming said second portion of said structural layer.

2. A method as claimed in claim 1 wherein said structural layer is formed from polysilicon, and said oxidation process is a local oxidation of silicon process implemented to thermally grow said oxide using said polysilicon of said structural layer.

3. A method as claimed in claim 1 wherein said removing produces conductive microstructures in said structural layer, and said second portion is entirely consumed to provide electrical isolation between adjacent ones of said conductive microstructures.

4. A method as claimed in claim 1 wherein said removing produces microstructures in said structural layer, said microstructures remaining following said performing operation.

5. A method as claimed in claim 1 wherein:
said second thickness of said first portion is approximately one half of said first thickness of said structural layer; and
a third thickness of said oxide following said performing is greater than said first thickness of said structural layer.

6. A method as claimed in claim 1 wherein said structural layer is formed over an oxide layer.

7. A method as claimed in claim 1 further comprising:
following said performing, forming an oxide layer over said structural layer and said oxide; and
planarizing said oxide layer.

8. A method as claimed in claim 1 wherein said substrate is a first substrate, and said method further comprises:
coupling a second substrate to said first substrate with said oxide interposed between said first and second substrates; and
forming an active region of a microelectromechanical systems (MEMS) device in said second substrate.

9. A method as claimed in claim 8 wherein said coupling comprises fusion bonding said second substrate to said first substrate.

10. A method as claimed in claim 8 wherein said second substrate is coupled to said first substrate in spaced apart relationship to produce a cavity between said first and second substrates.

11. A method as claimed in claim 8 further comprising performing said forming following said coupling.

12. A method as claimed in claim 8 further comprising forming an anchor structure extending through said second substrate and through said oxide formed on said first substrate.

13. A method as claimed in claim 8 wherein:
said removing produces a conductive microstructure of a microelectromechanical systems (MEMS) device in said structural layer;
following said performing, forming an oxide layer over said conductive microstructure and said oxide; and
following said coupling, exposing said conductive microstructure from said oxide layer.

14. A method of fabricating a microelectromechanical systems (MEMS) device comprising:
providing a first substrate having a structural layer formed thereon, said structural layer having a first thickness;
removing first portions of said structural layer at predetermined locations on said structural layer to produce conductive microstructures in said structural layer, each of said first portions of said structural layer having a second thickness that is less than said first thickness so that second portions of said structural layer remain at said predetermined locations;
performing an oxidation process at said predetermined locations to form an oxide, said oxidation process entirely consuming said second portions of said structural layer to provide electrical isolation between adjacent ones of said conductive microstructures;
coupling a second substrate to said first substrate with said oxide interposed between said first and second substrates; and
forming an active region of said microelectromechanical systems (MEMS) device in said second substrate following said coupling.

15. A method as claimed in claim 14 wherein said structural layer is formed from polysilicon, and said oxidation process is a local oxidation of silicon process implemented to thermally grow said oxide using said polysilicon of said structural layer.

16. A method as claimed in claim 14 further comprising:
following said performing, forming an oxide layer over said structural layer and said oxide;
planarizing said oxide layer; and
following said coupling, exposing said conductive microstructures from said oxide layer.

17. A method as claimed in claim 14 wherein said second substrate is coupled to said first substrate in spaced apart relationship to produce a cavity between said first and second substrates, said cavity underlying said active region of said MEMS device, and said conductive microstructures underlying said cavity.

* * * * *